United States Patent
Sato et al.

(10) Patent No.: US 8,980,004 B2
(45) Date of Patent: Mar. 17, 2015

(54) CRUCIBLE AND METHOD FOR PULLING A SINGLE CRYSTAL

(75) Inventors: Masaru Sato, Akita (JP); Masaki Morikawa, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 1333 days.

(21) Appl. No.: 12/692,456

(22) Filed: Jan. 22, 2010

(65) Prior Publication Data

US 2010/0180815 A1      Jul. 22, 2010

(30) Foreign Application Priority Data

Jan. 22, 2009   (JP) ................................ 2009-012129

(51) Int. Cl.
   *C30B 35/00*   (2006.01)
   *C30B 15/00*   (2006.01)
   *C30B 15/10*   (2006.01)

(52) U.S. Cl.
   CPC ............... *C30B 15/10* (2013.01); *Y10S 117/90* (2013.01)
   USPC ............ 117/200; 117/208; 117/213; 117/13; 117/900

(58) Field of Classification Search
   USPC .............................. 117/200, 208, 213, 13, 900
   See application file for complete search history.

(56) References Cited

U.S. PATENT DOCUMENTS

| | | | | |
|---|---|---|---|---|
| 5,919,306 A | * | 7/1999 | Takemura | 117/200 |
| 6,334,898 B1 | * | 1/2002 | Bommier | 117/200 |

FOREIGN PATENT DOCUMENTS

| | | | |
|---|---|---|---|
| JP | 57038398 A | * | 3/1982 |
| JP | 06-032692 A | | 2/1994 |
| JP | 09-235177 A | | 9/1997 |
| JP | 09-249494 A | | 9/1997 |
| JP | 2007-076974 A | | 3/2007 |
| JP | 2008-162840 A | | 7/2008 |

OTHER PUBLICATIONS

Patent Abstracts of Japan, English Computer Tranlsation of JP 09-235177 (2013).*
Patent Abstracts of Japan, English Computer Tranlsation of JP 2007-076974 (2013).*
Japanese Office Action mailed Mar. 28, 2012, issued in corresponding Japanese Patent Application No. 2009-012129, 6 pages.

* cited by examiner

*Primary Examiner* — Matthew Song
(74) *Attorney, Agent, or Firm* — Christensen O'Connor Johnson Kindness PLLC

(57) ABSTRACT

A crucible for pulling a silicon single crystal has a double structure comprising a silica crucible and a graphite crucible covering an outside of the silica crucible, wherein the silica crucible is provided at its opening end portion with an inward falling prevention means for imparting a radially outward force to a body portion of the silica crucible.

15 Claims, 3 Drawing Sheets

CRUCIBLE AND METHOD FOR PULLING A SINGLE CRYSTAL

BACKGROUND

1. Field of the Invention

This invention relates to a crucible used in the production of a silicon single crystal and more particularly to a crucible and a method for pulling a single crystal, which are used in a Czochralski method.

2. Description of the Related Art

Heretofore, the Czochralski method (hereinafter referred to as "CZ method") is used in the production of a silicon single crystal because of its advantages that a large crystal can be grown and that the speed of crystal growth is high and so on. FIG. 1 is a cross sectional view schematically illustrating a single crystal pulling device used in the CZ method. In this single crystal pulling device 1, a silicon single crystal 70 is grown by contacting a seed crystal 50 attached on a tip end of a pulling axis 40 with a surface of a melt 60 and then pulling the pulling axis upward.

As a crucible used in the single crystal pulling device 1 is generally used a crucible 10 for pulling a single crystal with a double structure comprising a silica crucible 20 and a graphite crucible 30 covering the outside of the silica crucible 20 as shown in FIG. 1.

The upper end of the crucible 10 is usually designed so that the side wall of the silica crucible is made higher than that of the graphite crucible. Therefore, when the crucible is exposed to a higher temperature during the pulling of a silicon single crystal, there are problems that the upper portion of the silica crucible is fallen down inward in a radial direction of the crucible and that buckling occurs due to the own weight of the silica crucible. In such cases, it is obliged to stop the pulling of the silicon single crystal.

FIGS. 4 and 5 are sectional side elevations illustrating deformations of the silica crucible generated during the pulling of the silicon single crystal, respectively. FIG. 4 illustrates a state that an upper end of a body portion in the silica crucible 20 is fallen down inward in a radial direction of the crucible (hereinafter referred to as "inward falling of the body portion in the silica crucible"). As the inward falling progresses, the body portion of the silica crucible 20 finally falls down into the melt 60, which adversely affects the pulling of the silicon single crystal. On the other hand, FIG. 5 illustrates a buckling state generated due to the own weight of the silica crucible, which also affects the pulling of the silicon single crystal adversely.

Therefore, there is disclosed a technique for preventing the above buckling and inward falling by rationalizing the shape of the silica crucible. For example, as disclosed in JP-A-H06-32692 and JP-A-H09-249494, there is a crucible for pulling a silicon single crystal, which comprises a silica crucible having a taperingly form of expanding a diameter of an upper portion upwardly and a graphite crucible.

However, the crucible for pulling a silicon single crystal as disclosed in JP-A-H06-32692 and JP-A-H09-249494 has a certain effect on the control of the buckling generation because the going down of the silica crucible can be suppressed based on the contact of the upper end portion of the graphite crucible with the upper portion of the silica crucible, whereas the control on the inward falling of the body portion in the silica crucible is not sufficient because there is a risk of causing the falling as shown in FIG. 6.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

It is, therefore, an object of the invention to provide a crucible and a method for pulling a single crystal, which can effectively control the buckling of the silica crucible and inward falling of its body portion by rationalizing the shape of the silica crucible.

The inventors have made various studies on the crucible for pulling a silicon single crystal with a double structure comprising the silica crucible and the graphite crucible covering the outside of the silica crucible for solving the above problems. As a result, it has been found that the occurrence of buckling can be controlled effectively by disposing an inward falling prevention means on an opening end portion of the silica crucible for imparting a radially outward force to the body portion of the silica crucible and that when the silica crucible is softened at a higher temperature by heating the melt, the falling of the body portion in the silica crucible can be directed outward in the radial direction of the crucible by the inward falling prevention means to effectively suppress the inward falling of the silica crucible.

In order to achieve the above object, the summary and construction of the invention are as follows:

1. A crucible for pulling a silicon single crystal with a double structure comprising a silica crucible and a graphite crucible covering an outside of the silica crucible, wherein the silica crucible is provided at its opening end portion with an inward falling prevention means for imparting a radially outward force to a body portion of the silica crucible.

2. A crucible for pulling a silicon single crystal according to item 1, wherein the inward falling prevention means is constructed at the opening end portion of the silica crucible as a diameter-expanded portion with a taperingly inclined part extending at an angle of 5 to 40° with respect to an upwardly extending direction of an inner surface of the body portion in the silica crucible at a state of separating from an opening end of the graphite crucible viewing at a section including a depth direction of the silica crucible.

3. A crucible for pulling a silicon single crystal according to item 1, wherein an outer diameter of the body portion in the silica crucible is gradually increased in a direction from the lower portion to the upper portion.

4. A crucible for pulling a silicon single crystal according to item 3, wherein the outer diameter of the body portion at an upper end of the silica crucible is larger by 1 to 10 mm than that of the body portion at a lower end thereof.

5. A crucible for pulling a silicon single crystal according to item 1, wherein the silica crucible is produced by an arc method.

6. A method for pulling a silicon single crystal which comprises using a crucible for pulling a silicon single crystal as described in any one of items 1 to 5.

According to the invention, it becomes possible to provide a crucible and a method for pulling a single crystal which can effectively control the buckling of the silica crucible and inward falling of its body portion by rationalizing the shape of the silica crucible.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

The invention will be described with reference to the accompanying drawings, wherein.

DETAILED DESCRIPTION

While illustrative embodiments have been illustrated and described, it will be appreciated that various changes can be made therein without departing from the spirit and scope of the invention.

Figure 1:
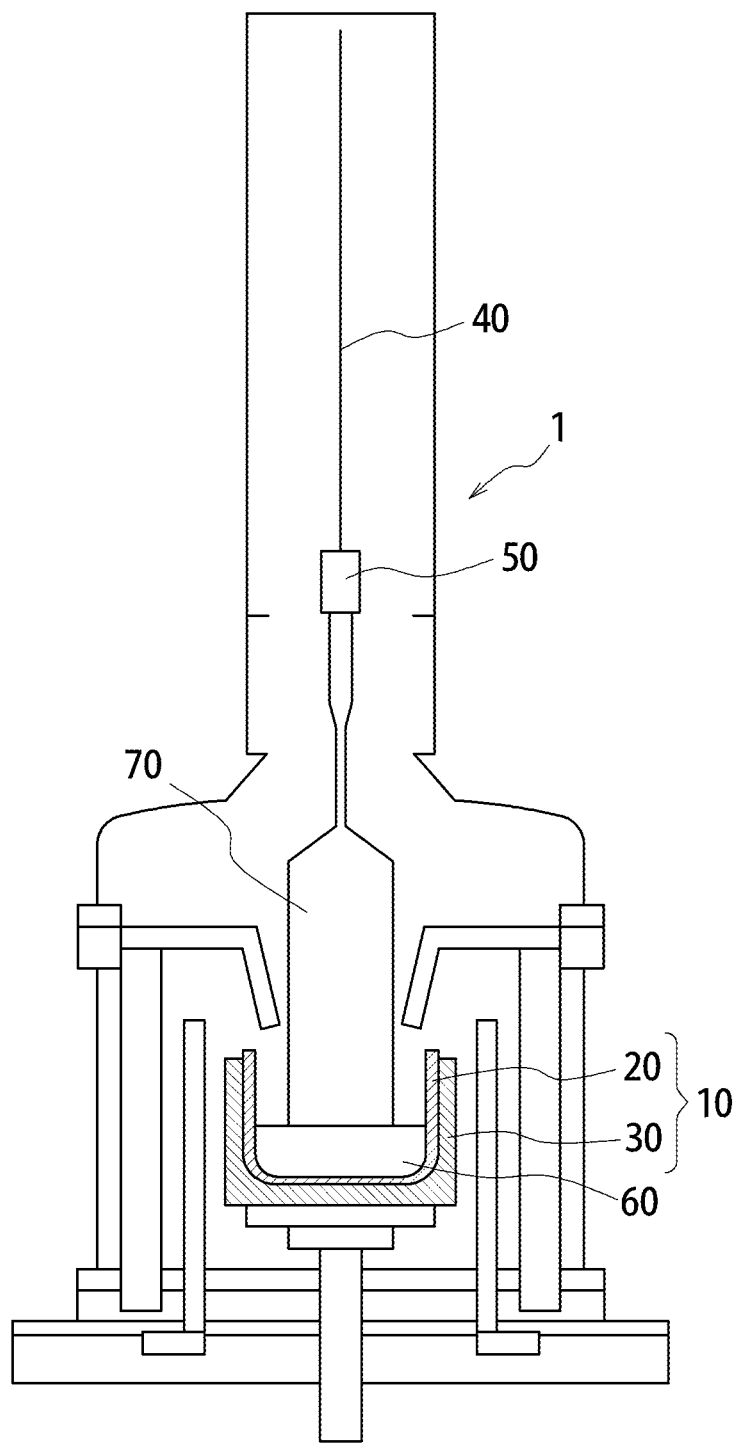
FIG. 1 is a cross-sectional view schematically illustrating a single crystal pulling device used in the CZ method.

The construction and limitation reason of the invention will be described with reference to FIGS. 1-3D. In FIG. 1 is schematically shown a sectional side elevation of the conventionally typical single crystal pulling device, and FIG. 2 is a sectional side elevation schematically illustrating an embodiment of the crucible for pulling a single crystal according to the invention, and FIGS. 3A-3D are sectional side elevations schematically illustrating an upper portion of a crucible as various embodiments of the crucible for pulling a single crystal according to the invention.

Figure 2:
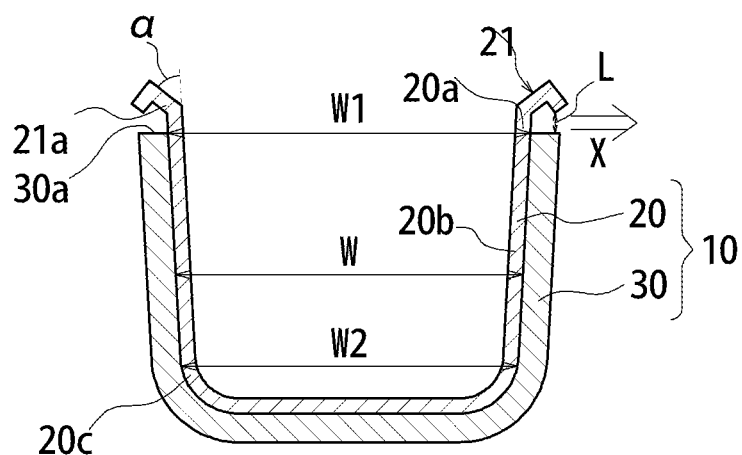
FIG. 2 is a sectional side elevation schematically illustrating an embodiment of the crucible for pulling a single crystal according to the invention.

The crucible for pulling a single crystal according to the invention is a crucible 10 for pulling a silicon single crystal with a double structure comprising a silica crucible 20 and a graphite crucible 30 covering the outside of the silica crucible 20 as shown in FIG. 2, in which the silica crucible 20 is provided at its opening end portion 20a with an inward falling prevention means 21 for imparting a radially outward force of the silica crucible 20 (arrow X) to a body portion 20b of the silica crucible 20.

When the above construction is adopted, the going down of the body portion 20b in the silica crucible is hardly caused by the inward falling prevention means and hence the occurrence of buckling can be controlled effectively, but also when the whole of the body portion 20b in the silica crucible 20 is softened at a higher temperature by heating a melt, a direction of falling down an opening end portion 20a of the body portion in the silica crucible can be made outward X in the radial direction of the crucible to effectively control the inward falling of the body portion 20b in the radial direction of the silica crucible.

Moreover, the shape of the inward falling prevention means 21 is not particularly limited as long as it has an effect of imparting a radially outward force (arrow X) to the silica crucible 20. Thus, in addition to the inward falling prevention means 21 shown in FIG. 2, there can be used various shapes of inward falling prevention means 21 as shown, for example, in FIGS. 3A to 3D.

Figure 3A:
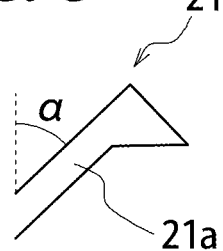
FIGS. 3A-3D are sectional side elevations schematically illustrating embodiments of an upper portion of the crucible for pulling a single crystal according to the invention.
Figure 3B:
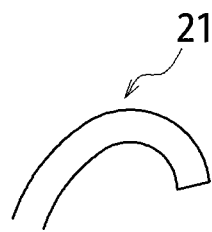

Among them, as shown in FIGS. 2, 3A and 3B, it is preferable that the inward falling prevention means 21 is constructed at the opening end portion 20a of the silica crucible as a diameter-expanded portion with a taperingly inclined part 21a extending at an angle ($\alpha$) of 5 to 40° with respect to an upwardly extending direction of an inner surface of the body portion in the silica crucible 20 at a state of separating from an opening end 30a of the graphite crucible 30 viewing at a section including a depth direction of the silica crucible 20. The reason why the inward falling prevention means 21 is separated from the opening end 30a of the graphite crucible 30 is due to the fact that if the inward falling prevention means 21 contacts with the opening end 30a of the graphite crucible 30, CO is generated by reaction between $SiO_2$ constituting the silica crucible 20 and C constituting the graphite crucible 30 and hence there is a risk of consuming each of the silica crucible 20 and the graphite crucible 30. The separation is more preferable to be a range of 5 to 20 mm as a closest distance between the opening end 30a of the graphite crucible and the inward falling prevention means 21 (distance L in FIG. 2) in view of surely preventing the reaction between $SiO_2$ and C. In order to easily understand the content of the invention, the distance L in FIG. 2 is exaggeratedly shown as compared with an actual distance L between the opening end 30a of the graphite crucible and the inward falling prevention means 21. When the inward falling prevention means 21 is disposed as the taperingly inclined part 21a extending at an angle of 5 to 40°, the production becomes easy owing to the taperingly inclined part. When the inclination angle is less than 5° or larger than 40°, the effect of imparting the radially outward force (arrow X) to the silica crucible 20 is small and there is a risk that the inward falling can not be controlled sufficiently.

Furthermore, an outer diameter W of the body portion 20b in the silica crucible 20 is preferable to be gradually increased in a direction from the lower portion to the upper portion as shown in FIG. 2. This improves the effect of controlling the inward falling and buckling of the body portion 20b in the silica crucible 20. On the other hand, when the outer diameter W is gradually decreased in a direction from the lower portion to the upper portion, there is a risk of generating the inward falling.

Figure 5:
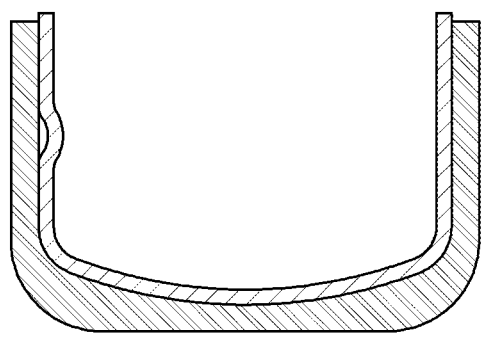
FIG. 5 is a sectional side elevation illustrating a buckling of a silica crucible generated during the pulling of a silicon single crystal.
Figure 6:
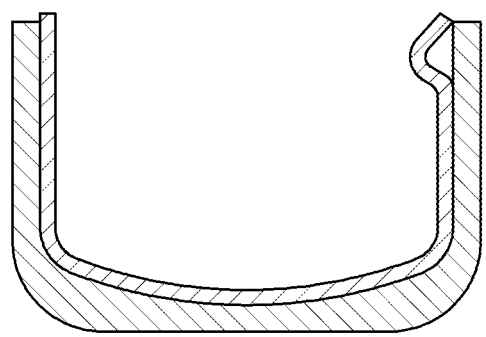
FIG. 6 is a sectional side elevation illustrating an inward falling of a silica crucible generated during the pulling of a silicon single crystal.

With respect to the silica crucible 20, it is more preferable that the outer diameter W1 at the opening end portion 20a (the upper end portion) of the body portion is larger by 1 to 10 mm than the outer diameter W2 at the lower end 20c of the body portion. When the difference in the outer diameter is less than 1 mm, there is a risk that the effect of controlling the inward falling and buckling of the body portion 20b in the silica crucible 20 can not be developed sufficiently, while when it exceeds 10 mm, the difference of the inner diameter in the crucible becomes large, and there is a risk that a starting point of the buckling is a position of a liquid level height when a silicon solution is dissolved (FIG. 5).

The size of the crucible for pulling a silicon single crystal according to the invention is not particularly limited since various sizes of crucibles are required depending on a size of a silicon single crystal ingot to be pulled up and the like. For example, a crucible having an outer diameter of 600 to 610 mm, a height of 360 to 400 mm and a thickness of 10 to 25 mm can be used as the silica crucible 20, while a crucible having an outer diameter of 605 to 615 mm, a height of 358 to 398 mm and a thickness of 15 to 20 mm can be used as the graphite crucible 30.

A method for producing the silica crucible is not particularly limited as long as the inward falling prevention means 21 having a particular shape can be produced with a high accuracy, but an arc method is preferably used. When the silica crucible is produced through arc melting, it can be produced in a short time by extensive high-temperature flame, which is advantageous in terms of cost, but also can be produced so as to fit on the desired form of the crucible. On the other hand, when the silica crucible is produced by the other production method, for example, by using an oxyhydrogen burner, the inward falling prevention means 21 is welded to the conventional silica crucible 20 and also the flame range is small, so that the working time becomes long and the production cost becomes large and further there is a risk of incorporating a large amount of hydroxyl group in the flame into a silica glass to cause the deterioration of the viscosity.

Then, there can be used a method for pulling a silicon single crystal using the crucible 10 for pulling a silicon single crystal according to the invention. When using such a method of pulling a silicon single crystal, it is possible to effectively control the buckling of the silica crucible 20 and the inward falling of the body portion 20b thereof.

Although the above is described with respect to only one embodiment of the invention, various modifications may be made without departing from the scope of the appended claims.

Example 1

As shown in FIG. 2, there is prepared a crucible 10 for pulling a silicon single crystal with a double structure comprising a silica crucible 20 having an outer diameter of 610 mm, a height of 380 mm and a thickness of 10 mm and a graphite crucible 30 covering the outside of the silica crucible 20 and having an inner diameter of 615 mm, a depth of 360 mm and a thickness of 15 mm.

Figure 3C:
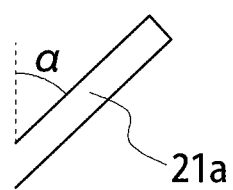
Figure 3D:
Figure 4:
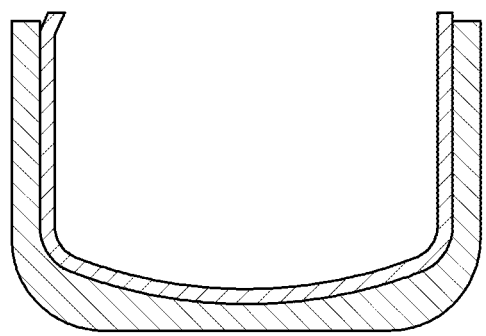
FIG. 4 is a sectional side elevation illustrating an inward falling of a silica crucible generated during the pulling of a silicon single crystal.

The silica crucible 20 is provided at its opening end portion with an inward falling prevention means 21 for imparting a radially outward force (X direction) to a body portion 20b of the silica crucible 20. The inward falling prevention means 21 has a shape as shown in FIG. 3C and is constructed as a diameter-expanded portion with a taperingly inclined part 21a extending at an angle of 10° with respect to an upwardly extending direction of the inner surface of the body portion 20b in the silica crucible 20 at a state of separating by 15 mm from the opening end 30a of the graphite crucible 30. The outer diameter W1 at an opening end portion 20a of the body portion is larger by 2 mm than the outer diameter W2 at the lower end 20c of the body portion.

Example 2

A crucible for pulling a silicon single crystal is prepared under the same conditions as in Example 1 except that the inward falling prevention means 21 of the silica crucible 20 has a shape as shown in FIG. 2 and is constructed as a diameter-expanded portion with a taperingly inclined part 21a extending at an angle of 40° with respect to an upwardly extending direction of the inner surface of the body portion 20b in the silica crucible 20 at a state of separating by 10 mm from the opening end 30a of the graphite crucible 30.

Comparative Example 1

A crucible for pulling a silicon single crystal is prepared as a common crucible for pulling a single crystal having no inward falling prevention means of Example 1.

Evaluation Method

Each crucible of Examples and Comparative Example is used in a single crystal pulling device as shown in FIG. 1 to conduct pulling of a silicon single crystal (continuation for 70 hours) five times under a pulling condition that a temperature of a silicon melt is 1450° C. Thereafter, the evaluation is carried out by recovering the silica crucible and then checking the presence or absence of inward falling and buckling.

TABLE 1

| | Inward falling prevention means | Difference in outer diameter between upper end and lower end of body portion (mm) | Evaluations | |
|---|---|---|---|---|
| | | | Presence or absence of inward falling | Presence or absence of buckling |
| Example 1 | Presence | 5.0 | Absence | Absence |
| Example 2 | Presence | 1.0 | Absence | Absence |
| Comparative Example 1 | Absence | 0.2 | Presence | Presence |

As seen from the results of Table 1, both inward falling and buckling of the body portion in the silica crucible can be controlled more effectively in Examples 1 and 2 using the crucible for pulling a silicon single crystal of the invention provided with the inward falling prevention means.

According to the invention, it becomes possible to provide a crucible and a method for pulling a single crystal which can effectively control the buckling of the silica crucible and inward falling of its body portion by rationalizing the shape of the silica crucible.

The invention claimed is:

1. A crucible for pulling a silicon single crystal, the crucible having a double structure comprising a silica crucible and a graphite crucible covering an outside portion of the silica crucible, wherein the silica crucible comprises, at an opening end portion, an inward falling prevention means configured to impart a radially outward force on a body portion of the silica crucible, wherein the inward falling prevention means is constructed at the opening end portion of the silica crucible as a diameter-expanded portion with a taperingly inclined part extending at an angle of 5° to 40° with respect to an upwardly extending direction of an inner surface of the body portion in the silica crucible at a point of separating from an opening end of the graphite crucible, and wherein the diameter-expanded portion has a protruding portion protruding in the radially outward direction at an angle with respect to the diameter-expanded portion.

2. A crucible for pulling a silicon single crystal according to claim 1, wherein an outer diameter of the body portion in the silica crucible is gradually increased in a direction from a lower portion to an upper portion.

3. A crucible for pulling a silicon single crystal according to claim 2, wherein an outer diameter of the body portion at the upper portion of the silica crucible is larger by 1 to 10 mm than that of the body portion at the lower portion.

4. A crucible for pulling a silicon single crystal according to claim 1, wherein the silica crucible is produced by an arc method.

5. A method for pulling a silicon single crystal, comprising pulling a silicon single crystal from a crucible for pulling a silicon single crystal of claim 1.

6. A crucible for pulling a silicon single crystal, the crucible having a double structure comprising a silica crucible and a graphite crucible covering an outside portion of the silica crucible, wherein the silica crucible comprises, at an opening end portion, an inward falling prevention means configured to impart a radially outward force on a body portion of the silica crucible, wherein the inward falling prevention means is constructed at the opening end portion of the silica crucible as a diameter-expanded portion with a taperingly inclined part extending at an angle of 5° to 40° with respect to an upwardly extending direction of an inner surface of the body portion in the silica crucible at a point of separating from an opening end of the graphite crucible, and wherein the diameter-expanded portion has a protruding portion having a thickness in the radially outward direction that is greater than a thickness of the diameter-expanded portion.

7. A crucible for pulling a silicon single crystal according to claim 6, wherein an outer diameter of the body portion in the silica crucible is gradually increased in a direction from a lower portion to an upper portion.

8. A crucible for pulling a silicon single crystal according to claim 7, wherein an outer diameter of the body portion at the upper portion of the silica crucible is larger by 1 to 10 mm than that of the body portion at the lower portion.

9. A crucible for pulling a silicon single crystal according to claim 6, wherein the silica crucible is produced by an arc method.

10. A method for pulling a silicon single crystal, comprising pulling a silicon single crystal from a crucible for pulling a silicon single crystal of claim 6.

11. A crucible for pulling a silicon single crystal, the crucible having a double structure comprising a silica crucible and a graphite crucible covering an outside portion of the silica crucible, wherein the silica crucible comprises, at an opening end portion, an inward falling prevention means configured to impart a radially outward force on a body portion of the silica crucible, wherein the inward falling prevention means is constructed at the opening end portion of the silica crucible as a diameter-expanded portion with a taperingly inclined part extending at an angle of 5° to 40° with respect to an upwardly extending direction of an inner surface of the body portion in the silica crucible at a point of separating from an opening end of the graphite crucible, and wherein the diameter-expanded portion terminates in a protruding portion curving in the radially outward direction.

12. A crucible for pulling a silicon single crystal according to claim 11, wherein an outer diameter of the body portion in the silica crucible is gradually increased in a direction from a lower portion to an upper portion.

13. A crucible for pulling a silicon single crystal according to claim 12, wherein an outer diameter of the body portion at the upper portion of the silica crucible is larger by 1 to 10 mm than that of the body portion at the lower portion.

14. A crucible for pulling a silicon single crystal according to claim 11, wherein the silica crucible is produced by an arc method.

15. A method for pulling a silicon single crystal, comprising pulling a silicon single crystal from a crucible for pulling a silicon single crystal of claim 11.

* * * * *